(12) United States Patent
Huang et al.

(10) Patent No.: US 11,935,439 B2
(45) Date of Patent: Mar. 19, 2024

(54) STRETCHABLE ELECTRONIC DEVICE

(71) Applicant: InnoLux Corporation, Miao-Li County (TW)

(72) Inventors: Yu-Chia Huang, Miao-Li County (TW); Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/122,721

(22) Filed: Mar. 17, 2023

(65) Prior Publication Data

US 2023/0230510 A1 Jul. 20, 2023

Related U.S. Application Data

(63) Continuation of application No. 16/907,126, filed on Jun. 19, 2020, now Pat. No. 11,626,039.

(30) Foreign Application Priority Data

Jul. 19, 2019 (CN) .......................... 201910657091.9

(51) Int. Cl.
*G09F 9/30* (2006.01)
*H01L 33/08* (2010.01)

(52) U.S. Cl.
CPC .............. *G09F 9/301* (2013.01); *H01L 33/08* (2013.01)

(58) Field of Classification Search
CPC ........................................................ H05K 5/00
See application file for complete search history.

(56) References Cited

U.S. PATENT DOCUMENTS

| | | | |
|---|---|---|---|
| 2017/0301724 A1* | 10/2017 | Lee | .......................... H01L 33/52 |
| 2018/0190672 A1* | 7/2018 | Lee | ....................... H01L 27/124 |
| 2021/0225961 A1 | 7/2021 | Sun | |

FOREIGN PATENT DOCUMENTS

| | | |
|---|---|---|
| CN | 103400850 A | 11/2013 |
| CN | 109923676 A | 6/2019 |

\* cited by examiner

*Primary Examiner* — Jerry Wu
(74) *Attorney, Agent, or Firm* — Winston Hsu

(57) ABSTRACT

A stretchable electronic device includes a first electronic unit including a first light emitting element, a second electronic unit including a second light emitting element and disposed adjacent to the first electronic unit, and an elasticity layer having a connecting region connecting the first display unit and the second display unit. In a top view of the stretchable electronic device, a size difference between the connecting region before stretching and the connecting region after stretching is greater than a size difference between the first electronic unit before stretching and the first electronic unit after stretching.

6 Claims, 16 Drawing Sheets

US 11,935,439 B2

STRETCHABLE ELECTRONIC DEVICE

CROSS REFERENCE TO RELATED APPLICATIONS

This application is a continuation application of U.S. application Ser. No. 16/907,126, filed on Jun. 19, 2020. The content of the application is incorporated herein by reference.

BACKGROUND OF THE DISCLOSURE

1. Field of the Disclosure

The present disclosure relates to a display device, more particularly to a display device comprising an elasticity layer.

2. Description of the Prior Art

In recent years, deformable electronic devices, such as a flexible display device or stretchable display device, have become one of the focuses in new generation electronic technique. Thus, demands of the design capable of offering deformable function to an electronic device is also increased. Because a deformable electronic device is still novel, industries need to keep researching suitable structures, materials and proper disposition method of elements in order to fabricate the deformable electronic device giving consideration to yields and cost.

SUMMARY OF THE DISCLOSURE

One of the purposes of the present disclosure is to provide a display device, wherein the display device comprises an elasticity layer located between the display units in order to offer deformable function to a display device.

An embodiment of the present disclosure provides a stretchable electronic device, wherein the stretchable electronic device includes a first electronic unit including a first light emitting element, a second electronic unit including a second light emitting element and disposed adjacent to the first electronic unit, and an elasticity layer having a connecting region connecting the first display unit and the second display unit. In a top view of the stretchable electronic device, a size difference between the connecting region before stretching and the connecting region after stretching is greater than a size difference between the first electronic unit before stretching and the first electronic unit after stretching.

An embodiment of the present disclosure provides a display device, wherein the display device comprises a first display unit, a second display unit and an elasticity layer. The first display unit comprises a first light emitting region, and the second display unit comprises a second light emitting region. The elasticity layer connects the first display unit and the second display unit. The elasticity layer comprises a concave corresponding to the first light emitting region in a top view direction of the display device.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "comprise", "include" and/or "having" are used in the present specification, it designates the existence of the feature, region, step, operation and/or element, but not exclude the existence or increase of one or more other features, regions, steps, operations, elements and/or combinations thereof. When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification regardless of the fabrication order of these constituent elements. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
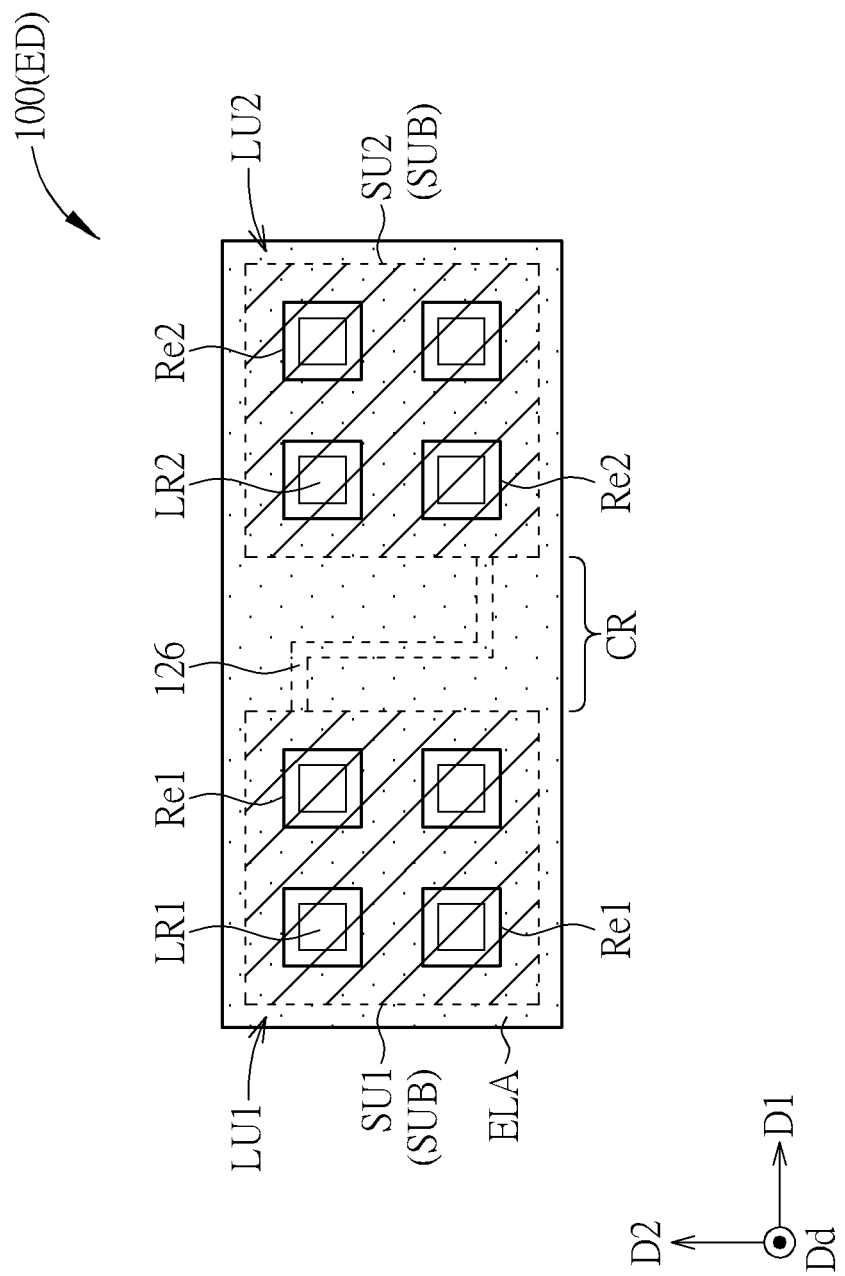
FIG. 1 schematically illustrates a partial top view of an electronic device according to a first embodiment of the present disclosure.
Figure 2:
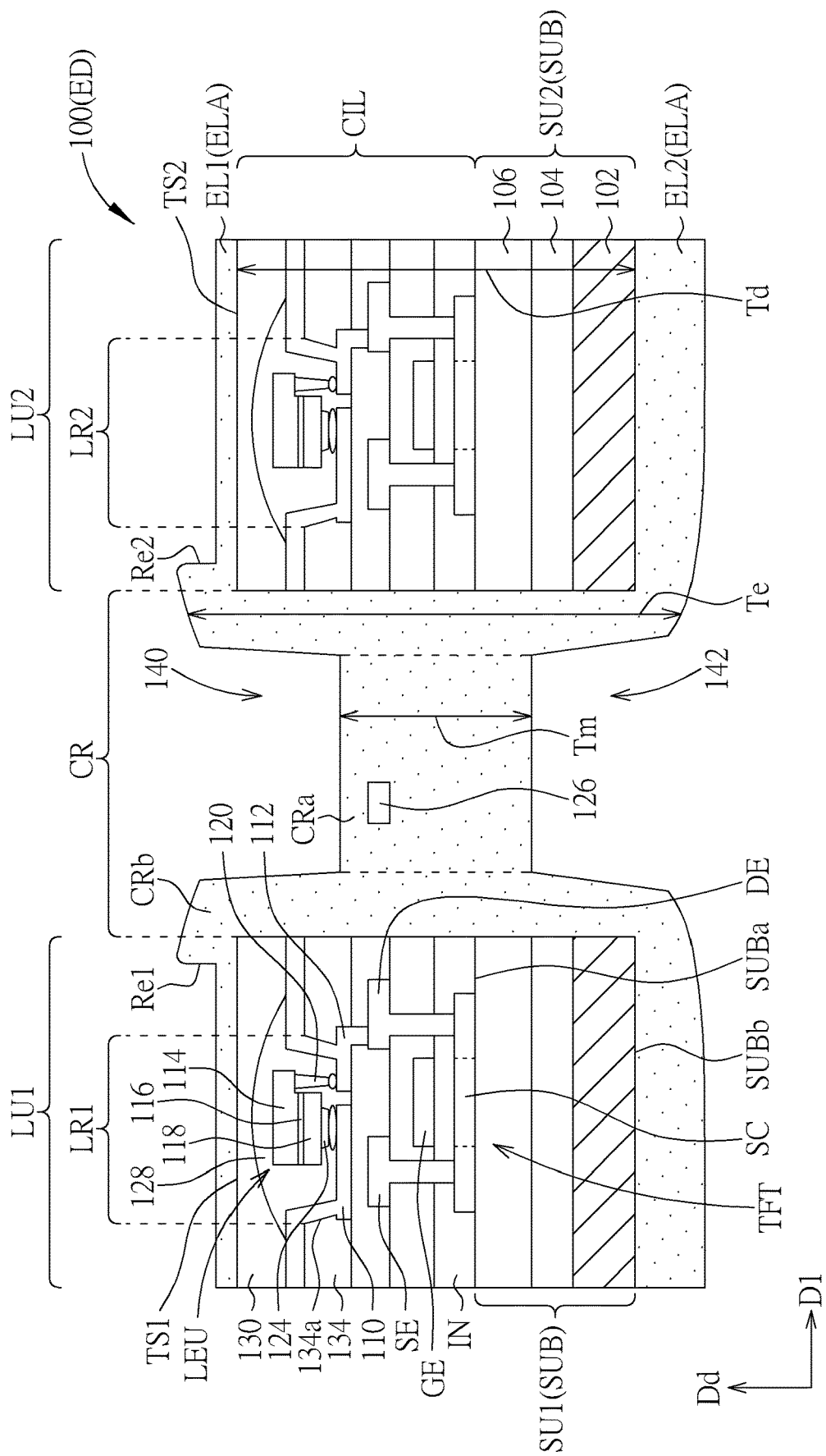
FIG. 2 schematically illustrates a cross-sectional view of the electronic device shown in FIG. 1 according to the present disclosure.

FIG. 1 schematically illustrates a partial top view of an electronic device according to a first embodiment of the present disclosure, and FIG. 2 schematically illustrates a cross-sectional view of the electronic device shown in FIG. 1 according to the present disclosure. The electronic device ED of the present disclosure may include display device, antenna, sensor, or tiled device, but not limited thereto. The electronic device ED may be a foldable or flexible electronic device. The electronic device may for example include liquid crystal light emitting diode, where the light emitting diode may for example include organic light emitting diode (OLED), inorganic light emitting diode (LED), mini light emitting diode (mini LED), micro light emitting diode (micro LED) or quantum dot light emitting diode (QLED or QDLED), and fluorescence, phosphor or other suitable materials and the combination thereof may be included in light emitting diodes or electronic devices, but not limited thereto. In one embodiment, the chip size of inorganic light emitting diodes may for example be in a range from 300 micrometers (μm) to 10 millimeters (mm), the chip size of mini light emitting diodes may for example be in a range from 100 micrometers (μm) to 300 micrometers (μm), and the chip size of micro light emitting diodes may for example be in a range from 1 micrometers (μm) to 100 micrometers (μm), but not limited thereto. The antenna may for example be a liquid crystal antenna, but not limited thereto. Tiled device may for example be a display tiled device or antenna tiled device, but not limited thereto. It is noted that the electronic device may be any arrangement or combination of previously mentioned device, and not limited thereto. In the following contents, the electronic device or tiled device is regarded as display device 100 in order to clarify the present disclosure, but the present disclosure is not limited to this. For example, when the electronic device is an antenna, one just needs to moderately replace the display unit with the working unit of antenna. Display device 100 may be a curved display, foldable display or flexible display, wherein the foldable display means that the display may be bent, folded, curved, stretched, flexed or other similar deformation (will be called as foldable in the following contents). The display may deform from a first status to a second status. In other words, the display may be curved or folded during operation. The display device 100 in the embodiments of the present disclosure may be various types of displays capable of displaying images or pictures such as non-self-luminous liquid crystal display (LCD), organic light emitting diode display, inorganic light emitting diode display, mini light emitting diode display, micro light emitting diode display, quantum dot light emitting diode display which are self-luminous, or electro-phoretic display (EPD), but not limited thereto.

The display device 100 of the present disclosure includes a first display unit LU1, a second display unit LU2 and an elasticity layer ELA. The first display unit LU1 includes a first light emitting region LR1, and the second display unit LU2 includes a second emitting region LR2. In detail, the first display unit LU1 and the second display unit LU2 may respectively include a plurality of layers and elements for displaying images or colors, but not limited thereto. Regarding the first display unit LU1 as an example, the first display unit LU1 may include a first substrate SU1, wherein the first substrate SU1 may include a plurality of materials or layers, such as substrate 102, buffer layer 104 and buffer layer 106. Substrate 102 may be a rigid substrate or a flexible substrate. Materials of the substrate may for example include glass, quartz, sapphire, metal, polyimide (PI), polycarbonate (PC), polyethylene terephthalate (PET) or combinations thereof, but not limited thereto. Number of the buffer layers disposed on the substrate 102 may be adjusted according to the demands, for example, may be one or more than two, and is not limited to the number shown in FIG. 2. In some embodiments, the first substrate SU1 may further include (but not limit to) an adhesive layer or supporting substrate. A control layer CIL may be disposed on a first surface SUBa of the first substrate SU1, the control layer CIL may include (but not limited to) a plurality of conductive lines, various electrical elements (such as switch elements, driving elements and/or capacitors) and light emitting elements. For example, the control layer CIL corresponding to the first light emitting region LR1 may include a transistor TFT and a light emitting element LEU. Although the transistors TFT shown in FIG. 2 is a top-gate type transistor, it may also be another type of transistor, such as bottom-gate type transistor. Besides, the type of transistors TFT in the same display device 100 is not limited to one type. Transistor TFT may serve as driving elements or switch elements, and may include semiconductor layer SC, dielectric layer IN, gate electrode GE, drain electrode DE, source electrode SE and other dielectric layers possibly existed in the transistor TFT. Semiconductor layer SC may be formed of semiconductor materials, such as silicon or metal oxide, but not limited thereto. For example, semiconductor layer SC may be amorphous silicon layer, poly silicon layer or indium gallium zinc oxide (IGZO) layer. In one of the transistors TFT, semiconductor layer SC may include a source electrode contact, a drain electrode contact and a channel region disposed between the source electrode contact and the drain electrode contact. Source electrode SE is electrically connected to the corresponding source electrode contact through a dielectric hole penetrating the dielectric layer IN. Drain electrode DE is electrically connected to the corresponding drain electrode contact through another dielectric hole penetrating the dielectric layer IN. Light emitting element LEU may include the light emitting diode mentioned above, but not limited thereto. The light emitting element LEU shown in FIG. 2 is a micro light emitting diode as an example. The light emitting element LEU is disposed in the opening 134a of the pixel defining layer 134. The light emitting element LEU may be a p-n diode, and may for example include a first semiconductor layer 114, a second semiconductor layer 118 and a multi quantum well (MQW) 116 disposed between the first semiconductor layer 114 and the second semiconductor layer 118. The light emitting element LEU may further include a first contact electrode 120 connected to the first semiconductor layer 114 and a second contact electrode 124 connected to the second semiconductor layer 118. In this embodiment, the first semiconductor layer 114 may be a p-type semiconductor layer, and the second semiconductor layer 118 may be an n-type semiconductor layer, or the first semiconductor layer 114 may be an n-type semiconductor layer, and the second semiconductor layer 118 may be a p-type semiconductor layer. The first contact electrode 120 may be electrically connected to the drain electrode DE of the transistor TFT through the connecting pad 112, and the transistor TFT may be the driving element or switch element of the light emitting element LEU. The second contact electrode 124 may be electrically connected to the wire of the common electrode or working voltage source through the connecting pad 110, but not limited thereto. The display device 100 may optionally include a protection layer 128 and a functional layer 130. The protection layer 128 may cover the corresponding light emitting element LEU, and may for example provide functions such as waterproofness or oxygen prevention. The functional layer 130 may entirely cover the surface of the first substrate SU1, and may for example include an encapsulation layer, a touch layer, a cover layer, an anti-reflection layer, a protection layer, or an insulating layer, or a combination of any of the above-mentioned layers. In other embodiments, the protection layer 128 and/or the functional layer 130 may be a multi-layer structure, such as a multi-layer structure formed of stacking of an inorganic layer/organic layer/inorganic layer or an inorganic layer/organic layer/inorganic layer/organic layer/inorganic layer. It should be noted that a layer structure may be regard as a film, but not limited thereto. As shown in FIG. 2, the first display unit LU1 represents the layers from the first substrate SU1 to the functional layer 130. The area of a first display unit LU1 may be defined by a single first substrate SU1, that is, the area of a first display unit LU1 may be represented as the area of the first substrate SU1. The first display unit LU1 may include a plurality of first light emitting region LR1. In some embodiments, the first light emitting region LR1 may be defined by the opening 134a of the pixel defining layer 134. In some other embodiments, the first light emitting region LR1 may be defined by the area of the light emitting diode, but not limited thereto. In other embodiments, the light emitting element LEU may optionally be a vertical type light emitting diode, wherein the two contact electrodes are located at two sides of the semiconductor layer respectively, but not limited thereto.

The structure of the second display unit LU2 is similar to the first display unit LU1, which includes a second substrate SU2, and a control layer CIL is disposed thereon. The control layer CIL may include transistor TFT and light emitting element LEU. The light emitting element LEU is located in the opening 134a of the pixel defining layer 134, and the protection layer 128 and the functional layer 130 may be disposed thereon. In some embodiments, the area of the second light emitting region LR2 may be defined by the opening 134a of the pixel defining layer 134, or, the size of the second light emitting region LR2 may be defined by the area of the light emitting diode of the light emitting element LEU. The second substrate SU2 and the first substrate SU1 may be formed of the same material or different materials. In some embodiments, the second substrate SU2 and the first substrate SU1 may be formed by the same substrate SUB, and a portion of the substrate SUB is removed during the process to form the first substrate SU1 and the second substrate SU2 which are not connected to each other. The total thickness of the second display unit LU2 may be represented as thickness Td, which is measured from the second surface SUBb of the substrate SUB (that is, the lower surface of the substrate SUB) to the upper surface of the functional layer 130. Similarly, the total thickness of the first display unit LU1 may be defined by the same way and may be represented as thickness Td. Other details of the second display unit LU2 will not be redundantly described here.

The elasticity layer ELA of the display device 100 connects the first display unit LU1 and the second display unit LU2. At least a portion of the elasticity layer ELA is overlapped with the first display unit LU1 or the second display unit LU2 on a display direction Dd of the display device 100. Specifically, the elasticity layer ELA may partially overlap the first display unit LU1 and the second display unit LU2 or totally cover the first display unit LU1 and the second display unit LU2. Besides, the elasticity layer ELA includes a concave Re1 corresponding to the first light emitting region LR1, and may also include a concave Re2 corresponding to the second light emitting region LR2 on the display direction Dd (top view direction) of the display device 100. In some embodiments, the portion of the elasticity layer ELA corresponding to the first display unit LU1 may include a plurality of concaves Re1, the concaves Re1 may for example be arranged in an array along a direction D1 and a direction D2, and the direction D1 and the direction D2 which are shown in FIG. 1 may for example be perpendicular to each other, but not limited thereto. Similarly, the portion of the elasticity layer ELA corresponding to the second display unit LU2 may include a plurality of concave Re2 arranged in an array along the direction D1 and the direction D2. The shape of the concave Re1 and the concave Re2 may be rectangular or square in a top view, as shown in FIG. 1, but not limited thereto. In other embodiments, the concave Re1 and the concave Re2 may have variant pattern design. As shown in FIG. 2, in some embodiments, the bottom of the concave Re1 and the concave Re2 have elasticity layer ELA, that is, the upper surface TS1 of the first light emitting region LR1 and the upper surface TS2 of the second light emitting region LR2 are covered by the elasticity layer ELA. The ratio of the area of the concave Re1 corresponding to the first display unit LU1 to the area of the first display unit LU1 is greater than or equal to 0.5 and less than 1. In detail, as shown in FIG. 1, there are four concaves Re1 corresponding to the first display unit LU1, and the ratio of the total area of these four concaves Re1 to the area of the first display unit LU1 (area of the first substrate SU1) is greater than or equal to 0.5 and less than 1, but not limited thereto. The area of the concave Re1 is measured and defined by the bottom area thereof. For example, the borders of the bottom area may be defined by the bottom of the sidewall. Besides, the area of the concave Re1 may also be calculated as the projection area of the bottom of the concave Re1 on the substrate SUB. If the bottom of the concave Re1 has a rough structure, the surface area of the rough structure should be neglected when calculating the area of the concave Re1. The area ratio of the second display unit LU2 to the concave Re2 may have similar design, and will not be redundantly described here.

The portion of the elasticity layer ELA located between the first display unit LU1 and the second display unit LU2 may be defined as a connection region CR for connecting the first display unit LU1 and the second display unit LU2. In detail, the connection region CR may include a first portion CRa and a second portion CRb, and the thickness of the first portion CRa may be different from the thickness of the second portion CRb. For example, the second portion CRb would cover the periphery of the first display unit LU1, which includes covering the outer edge and sidewall of the upper surface and the lower surface, and the maximum thickness Te of the second portion CRb may be greater than the thickness Td of the first display unit LU1. In another aspect, the thickness of the first portion CRa may be adjusted according to the demands of product design. For example, the minimum thickness Tm of the connection region CR (that is, the thickness of the first portion CRa) may be the same as the thickness Td of the first display unit LU1 or different from (greater than or less than) the thickness Td of the first display unit LU1. In the embodiment shown in FIG. 2, the minimum thickness Tm of the connection region CR is less than the thickness Td of the first display unit LU1. In an embodiment, measurement of the thickness Td may be performed at the position adjacent to the source electrode SE or drain electrode DE of the transistor TFT that is electrically connected to the light emitting element LEU. In an embodiment, the measurement of the thickness Te may be performed at the position slightly away from the display unit region and the connection region CR (exclude extreme values of regional boundaries). In another embodiment, the measurement of the thickness Tm may be performed at the position slightly away from the boundary of the first portion CRa and the second portion CRb (exclude extreme values of regional boundaries). The above-mentioned measurements are performed before stretch.

When the display device 100 is deformed (such as stretched), the first portion CRa of the connection region CR is the main deformable portion of the display device 100. For example, the first portion CRa of the connection region CR may be laterally stretched along the direction D1, but not limited thereto. As shown in FIG. 2, because the first portion CRa has less thickness Tm comparing to the second portion CRb in some embodiments, the elasticity layer ELA may include upper recess 140 and lower recess 142. In some other embodiments, the elasticity layer ELA may include one of the upper recess 140 and lower recess 142, or none of the upper recess 140 and lower recess 142. Besides, the conductive line 126 may be disposed in the connection region CR, and the material of the conductive line 126 may be the same as any conductive material in the control layer CIL (for example, the conductive line 126 and the source electrode SE may be formed of the same conductive layer), but not limited thereto. The pattern of the conductive line 126 shown in the FIGs is only illustrative, the number, pattern and disposition of the conductive line 126 may be adjusted according to the demands. For example, the conductive line 126 may include a signal line for transferring the required signals (such as the signals of the gate electrode GE) in display operation, but not limited thereto. Furthermore, the portion of the elasticity layer ELA covering the first display unit LU1 and the second display unit LU2 may be regarded as a top elasticity layer EL1, and the portion of the elasticity layer ELA disposed at the lower side of the substrate SUB may be regarded as a bottom elasticity layer EL2. The elasticity layer ELA may for example include (but not limited to) resin or other suitable materials, the elasticity layer ELA may be a light transmissive layer or low light transmissive layer, such as a photoresist layer, the elasticity layer ELA may be a material layer with low light transmittance, for example, the transmittance is less than 50% in a wavelength range of visible light, but not limited thereto. The elasticity layer ELA may effectively separate the output lights emitted from different concaves. In the embodiments shown in FIG. 2, a thinner elasticity layer ELA covering the first light emitting region LR1 and the second light emitting region LR2 is existed in the concave Re1 and the concave Re2, and the material of the elasticity layer ELA may possess greater light transmittance. In some embodiment, the elasticity layer ELA may be a light blocking layer. The portion of the elasticity layer ELA corresponding to the first light emitting region LR1 has concave Re1, and the portion of the elasticity layer ELA corresponding to the second light emitting region LR2 has concave Re2, such that the effect of the elasticity layer ELA on optical performance may be reduced. In another aspect, when the display device 100 is deformed, the elasticity layer ELA may be correspondingly stretched. Because the elasticity layer ELA located on the surface of the first light emitting region LR1 and the second light emitting region LR2 is thinner in this embodiment, the effect of the elasticity layer ELA on the first light emitting region LR1 and the second light emitting region LR2 is reduced when the elasticity layer ELA is stretched.

The electronic device, display device and the fabrication method thereof of the present invention are not limited to the above-mentioned embodiments. Other embodiments or variant embodiments would be disclosed in the following content. To simplify the descriptions and highlight the difference between each of the embodiments and variant embodiments, the same element would be labeled with the same symbol, and the identical features will not be redundantly described. Besides, the material, thickness and fabrication process of each of the layers in the below-mentioned embodiments may refer to the first embodiment, and will not be redundantly described.

Figure 3:
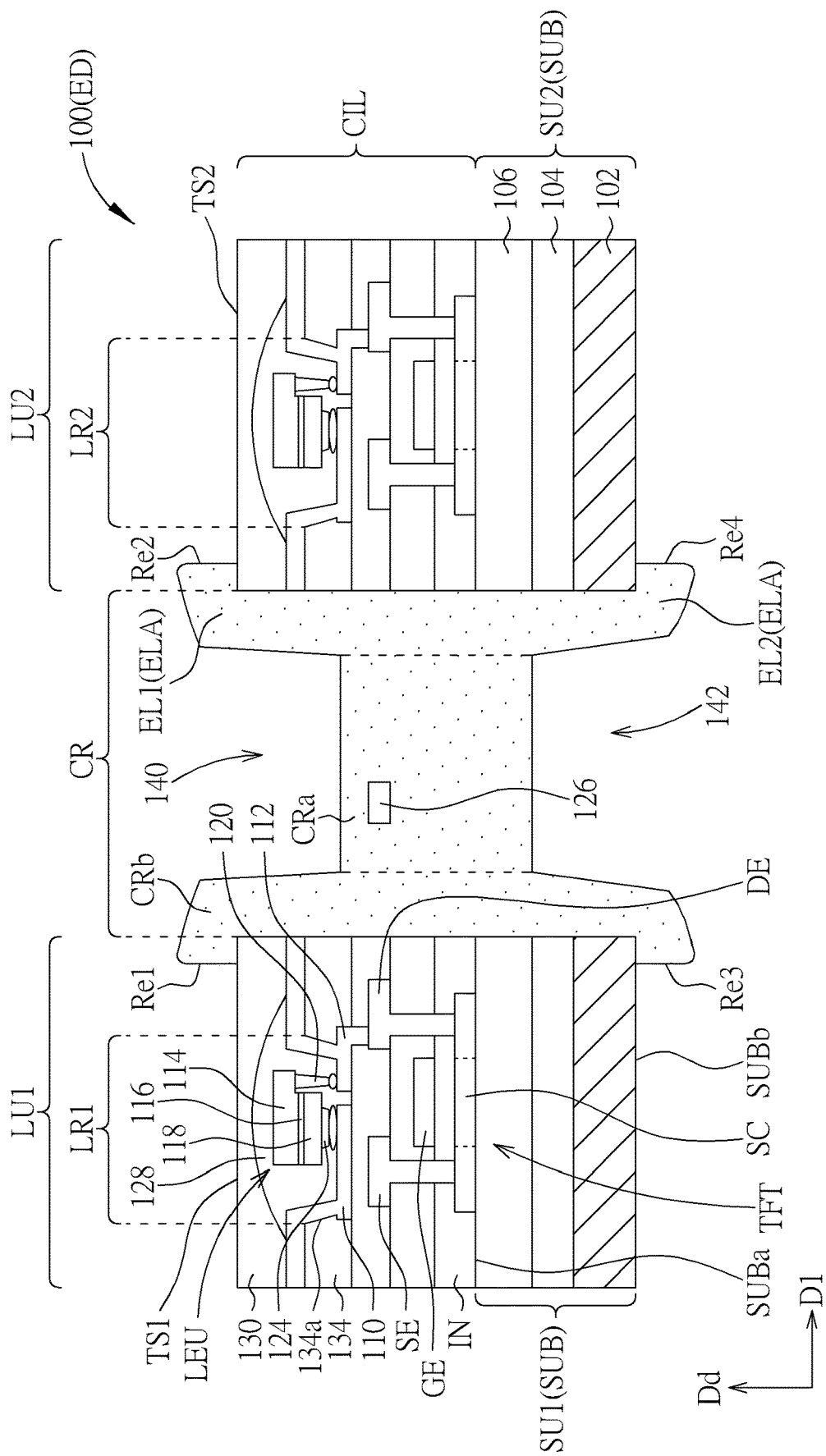
FIG. 3 schematically illustrates a partial cross-sectional view of an electronic device according to a second embodiment of the present disclosure.

FIG. 3 schematically illustrates a partial cross-sectional view of an electronic device according to a second embodiment of the present disclosure. The concave Re1 and the concave Re2 of the elasticity layer ELA of the display device 100 shown in FIG. 3 respectively exposes a portion of the first display unit LU1 and the second display unit LU2. In other words, the elasticity layer ELA is not included in the bottom of the concave Re1, and at least a portion of the functional layer 130 of the first display unit LU1 is directly exposed at the bottom of the concave Re1 and not covered by the elasticity layer ELA. In some embodiment, the concave Re1 exposes the top surface of the first display unit LU1. Similarly, the elasticity layer ELA is not included in the bottom of the concave Re2, and at least a portion of the functional layer 130 of the second display unit LU2 is directly exposed at the bottom of the concave Re2 and not covered by the elasticity layer ELA. The design makes the surfaces of the first light emitting region LR1 and the second light emitting region LR2 not include elasticity layer ELA, and the effect of elasticity layer ELA on optical performance may be reduced. In another aspect, when the display device 100 is deformed, the surfaces of the first light emitting region LR1 and the second light emitting region LR2 would not be easily stretched by the elasticity layer ELA. Furthermore, the elasticity layer in FIG. 3 may further include a bottom concave Re3 corresponding to the concave Re1 and a bottom concave Re4 corresponding to the concave Re2. The bottom concave Re3 exposes the second surface SUBb (that is, the lower surface of the first substrate SU1) of the first substrate SU1. Moreover, the bottom elasticity layer EL2 is not overlapped with the first light emitting region LR1 on the display direction Dd of the display device 100. Similarly, The bottom concave Re4 exposes the second surface SUBb (that is, the lower surface of the second substrate SU2) of the second substrate SU2. In other words, the bottom elasticity layer EL2 is not overlapped with the second light emitting region LR2 on the display direction Dd of the display device 100. In another aspect, a thinner bottom elasticity layer EL2 may exist at the bottom of the bottom concave Re3 and the bottom concave Re4 to cover the second surface SUBb of the substrate SUB, and the display units are not exposed. The term "exposed" here represents the region not covered by the elasticity layer ELA, and not limited to the case that other layers cover the regions exposed by the elasticity layer ELA. For example, in the embodiment shown in FIG. 3, the surface of the first light emitting region LR1 and the second light emitting region LR2 may optionally include others layers like a protection layer or anti-scratch layer which would not affect optical performance according to the demands of the design.

Figure 4:
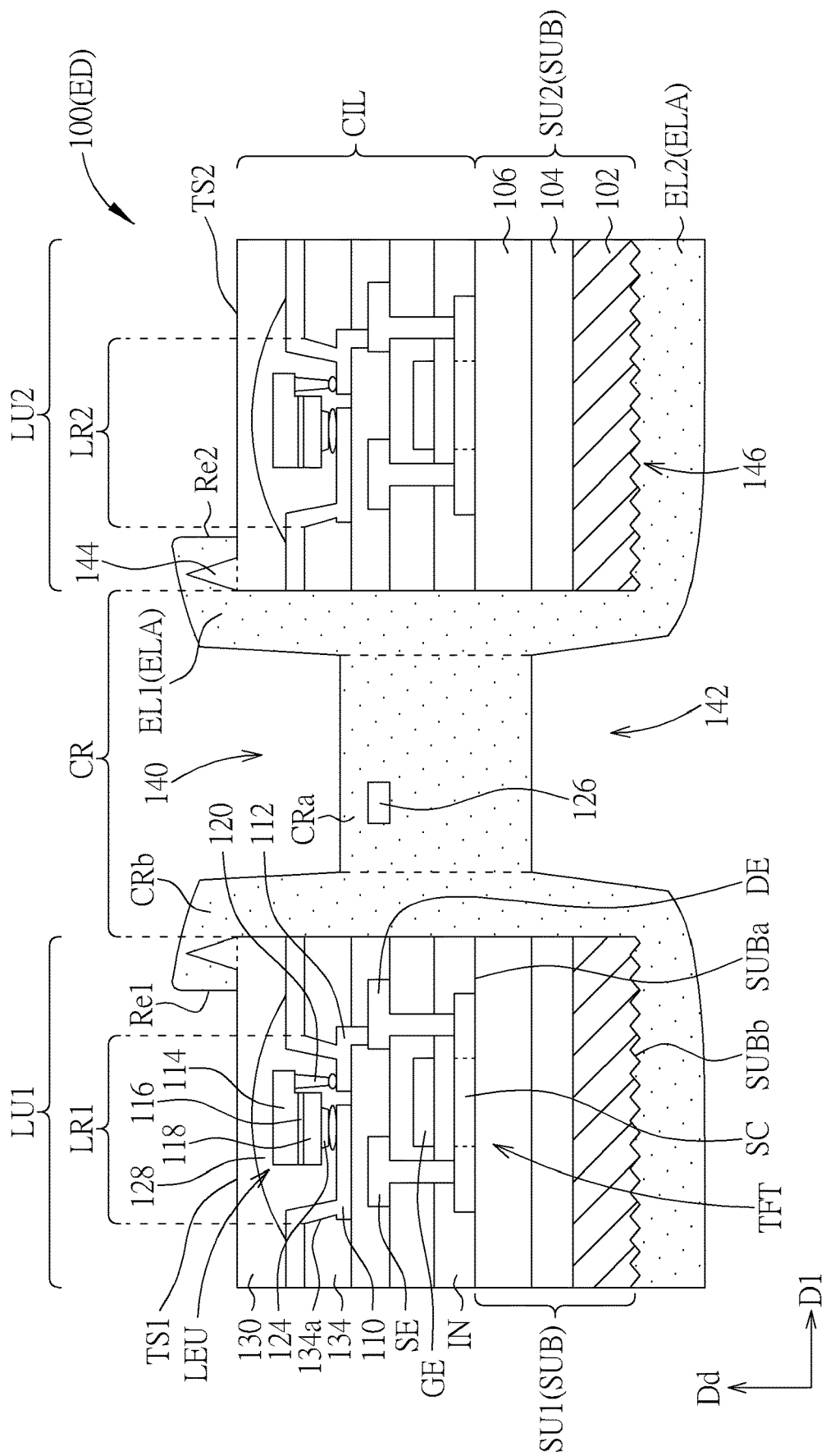
FIG. 4 schematically illustrates a partial cross-sectional view of an electronic device according to a third embodiment of the present disclosure.

FIG. 4 schematically illustrates a partial cross-sectional view of an electronic device according to a third embodiment of the present disclosure. As shown in FIG. 4, the first display unit LU1 may include a protrusion 144 located on the upper surface of the first display unit LU1, and the protrusion 144 may be covered by the top elasticity layer EL1 and directly contacted with the top elasticity layer EL'. The protrusion 144 may be formed of the material which is the same as or different from the functional layer 130. The protrusion 144 may include insulating material or packaging material. For example, a half tone mask or a half gray scale mask may be used to define the pattern of the functional layer 130 (for example, the patterned functional layer 130 may be respectively disposed corresponding to the first substrate SU1 and the second substrate SU2) in the process of forming the functional layer 130, and the protrusion 144 may be formed at the same time. The protrusion 144 may improve the adhesive of the top elasticity layer EL1 to the first display unit LU1. The surface of the second display unit LU2 may include protrusion 144, and will not be redundantly described here. In some embodiments, the second surface SUBb of the substrate SUB may include a rough structure 146, wherein the rough structure 146 is covered by the elasticity layer ELA. In the process of forming the display device 100, a supporting substrate may be adhered to the lower side of the substrate SUB through an adhesive layer at first, and after the control layer CIL and the top elasticity layer EL1 are formed, a laser light may be adopted to irradiate the adhesive layer, such that the adhesive layer and the supporting substrate may be removed from the substrate SUB. Gas such as hydrogen may be produced from the adhesive layer after the adhesive layer is irradiated by laser light, and the gas may forma rough surface on the second surface SUBb of the substrate SUB, which is the rough structure 146. After that, the bottom elasticity layer EL2 may be formed on the second surface SUBb of the substrate SUB. The rough structure 146 may improve the adhesive performance between the bottom elasticity layer EL2 and the substrate SUB.

Figure 5:
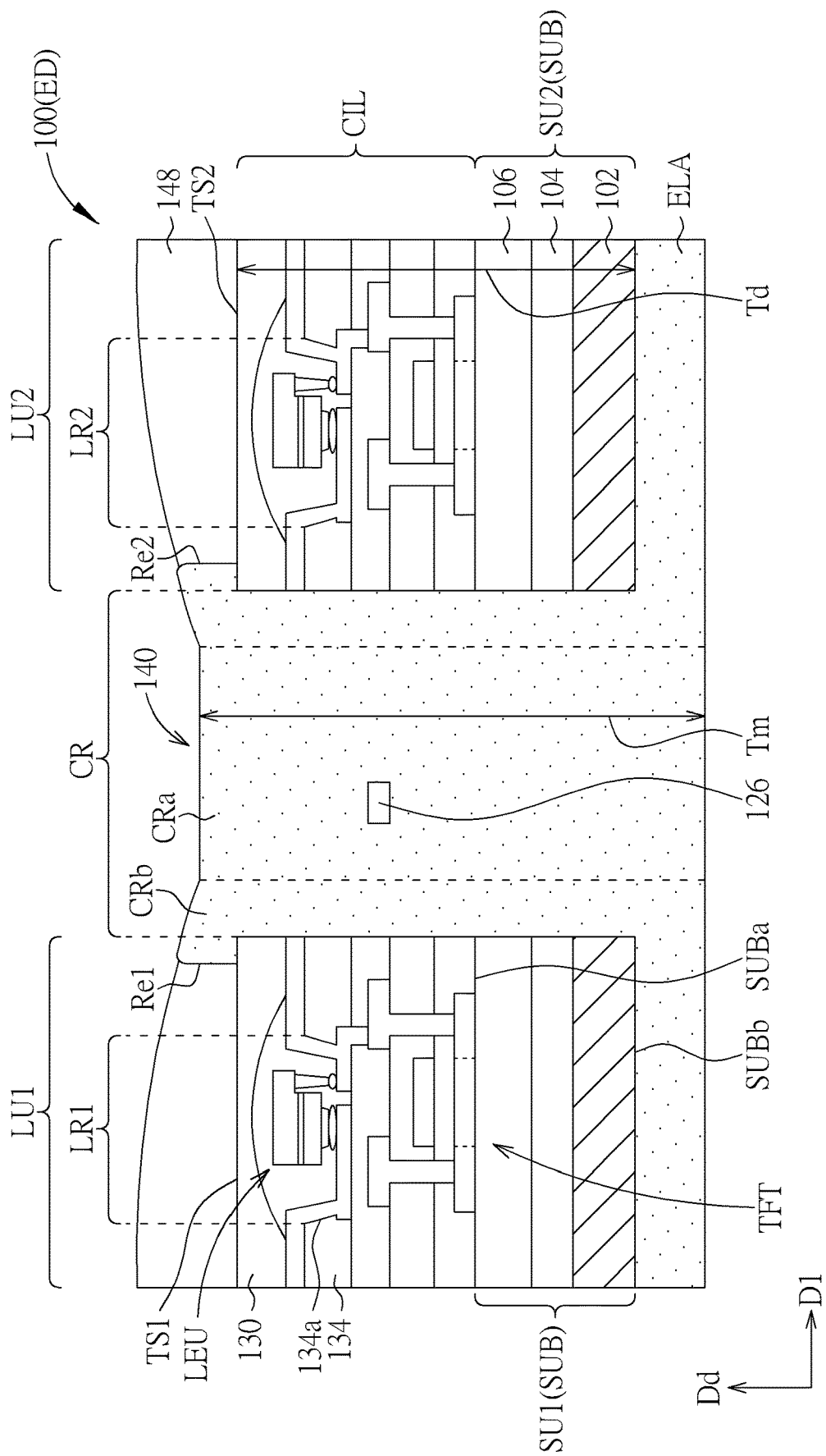
FIG. 5 schematically illustrates a partial cross-sectional view of an electronic device according to a fourth embodiment of the present disclosure.

FIG. 5 schematically illustrates a partial cross-sectional view of an electronic device according to a fourth embodiment of the present disclosure. In the display device 100 shown in FIG. 5, the concave Re1 and the concave Re2 of the elasticity layer ELA of the display device 100 respectively exposes a portion of the first display unit LU1 and the second display unit LU2 in comparison to the first embodiment of the present invention. The minimum thickness Tm of the first portion CRa of the connection region CR of the elasticity layer ELA is greater than the total thickness Td of the first display unit LU1 or the second display unit LU2. Besides, another insulating layer 148 may be disposed on the top surface TS1, TS2 of the portions of the first light emitting region LR1 and the second light emitting region LR2 which are not covered by the elasticity layer ELA, and a portion of the insulating layer 148 may be disposed in the concave Re1 and the concave Re2. The material of the insulating layer may be waterproof or oxygen-prevented to protect the first light emitting region LR1 and the second light emitting region LR2, such that the reliability of the light emitting element LEU and electronic element in the first light emitting region LR1 and the second light emitting region LR2 may be improved. The thickness and height of the insulating layer 148 is not limited to what is shown in FIG. 5, for example, in some embodiments, the height of the insulating layer 148 may be less than the height of the elasticity layer ELA located at two sides of the concave Re1 and the concave Re2.

Figure 6:
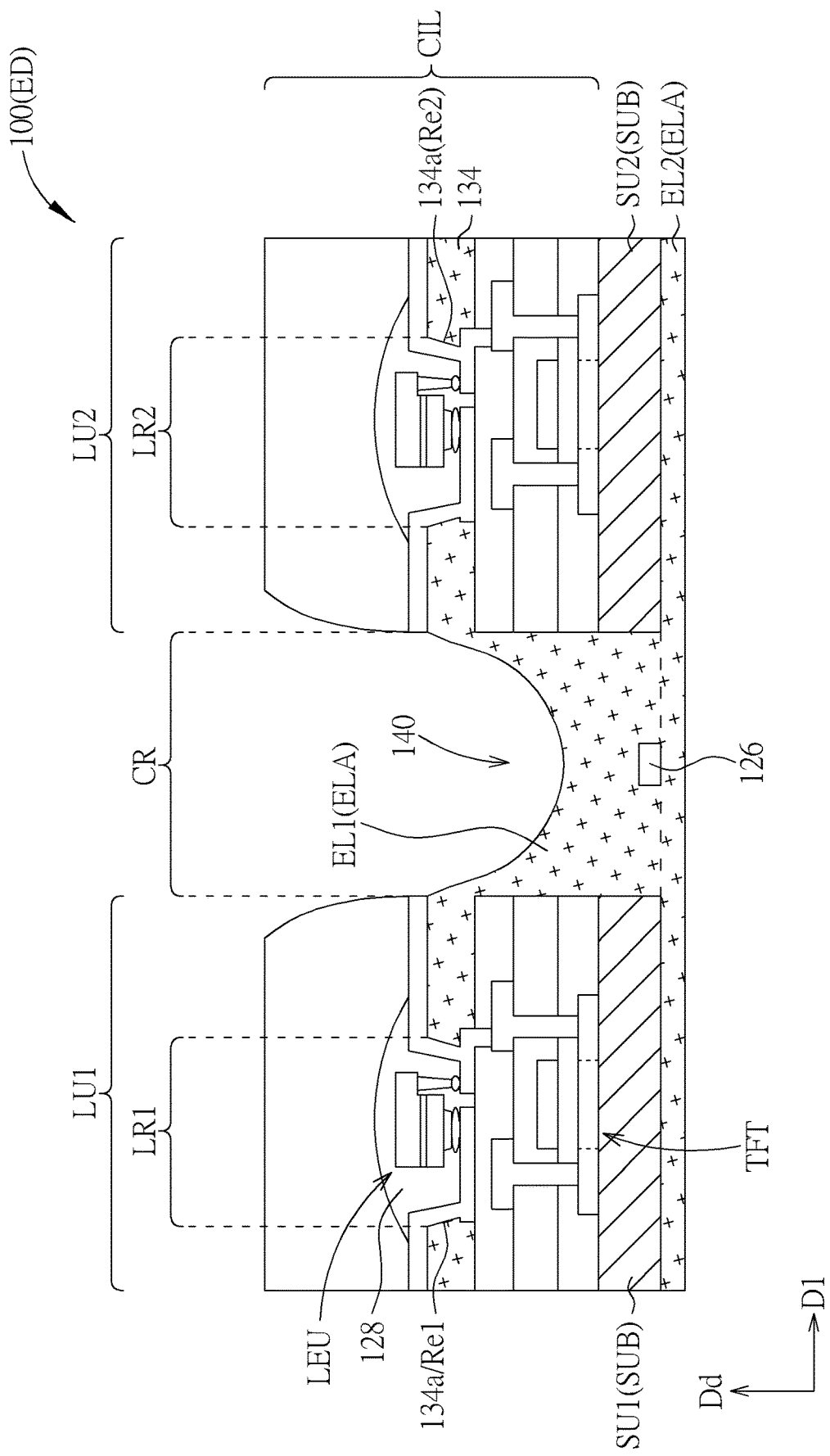
FIG. 6 schematically illustrates a partial cross-sectional view of an electronic device according to a fifth embodiment of the present disclosure.

FIG. 6 schematically illustrates a partial cross-sectional view of an electronic device according to a fifth embodiment of the present disclosure. The elasticity layer ELA (or a portion of the elasticity layer ELA) of the display device 100 shown in FIG. 6 may be one of the control layers CIL. For example, the pixel defining layer 134 may be the top elasticity layer EL1, and the pixel defining layer 134 may extend to the position between the first display unit LU1 and the second display unit LU2 to connect these two display units. In such design, the openings 134a of the pixel defining layer 134 may be defined as concave Re1 and concave Re2, and the concave Re1 and the concave Re2 may respectively correspond to the first light emitting region LR1 and the second light emitting region LR2. In some embodiments, the substrate SUB may include fewer layers in comparison to the above-mentioned embodiments, such as one of the buffer layer 106 and substrate 102 shown in FIG. 2. For example, in such design, the forming process of the display device 100 may include forming a bottom elasticity layer EL2 on the supporting substrate at first, and then, a thinner substrate SUB (such as a buffer layer or a substrate) and a circuit layer (such as transistor, conductive line and interlayer dielectric layer) may be formed in order on the bottom elasticity layer EL2, such that the substrate SUB may be patterned to form the first substrate SU1 and the second substrate SU2 which are phase separated, the bottom elasticity layer EL2 between the first substrate SU1 and the second substrate SU2 may be exposed, and then the pixel defining layer 134, the light emitting element LEU, the protection layer 128 and the patterned functional layer 130 may be formed, wherein the pixel defining layer 134 is formed between the first substrate SU1 and the second substrate SU2. After that, the supporting substrate located below the bottom elasticity layer EL2 may be removed to form the display device 100 shown in FIG. 6. In another embodiment, a substrate SUB with better support may be provided at first, a circuit layer may be formed on the substrate SUB, and the circuit layer may be patterned to separate the first display unit LU1 and the second display unit LU2 to form the circuit layer gap. After that, elements such as the pixel defining layer 134, the light emitting element LEU and the functional layer 130, the related conductive lines, the connecting pads or the electrodes may be formed, wherein the pixel defining layer 134 may overlap the substrate SUB between the first display unit LU1 and the second display unit LU2. Finally, the substrate SUB may be patterned to form a concave on the lower surface of the substrate SUB to finish the preliminary production of the display device 100.

Figure 7:
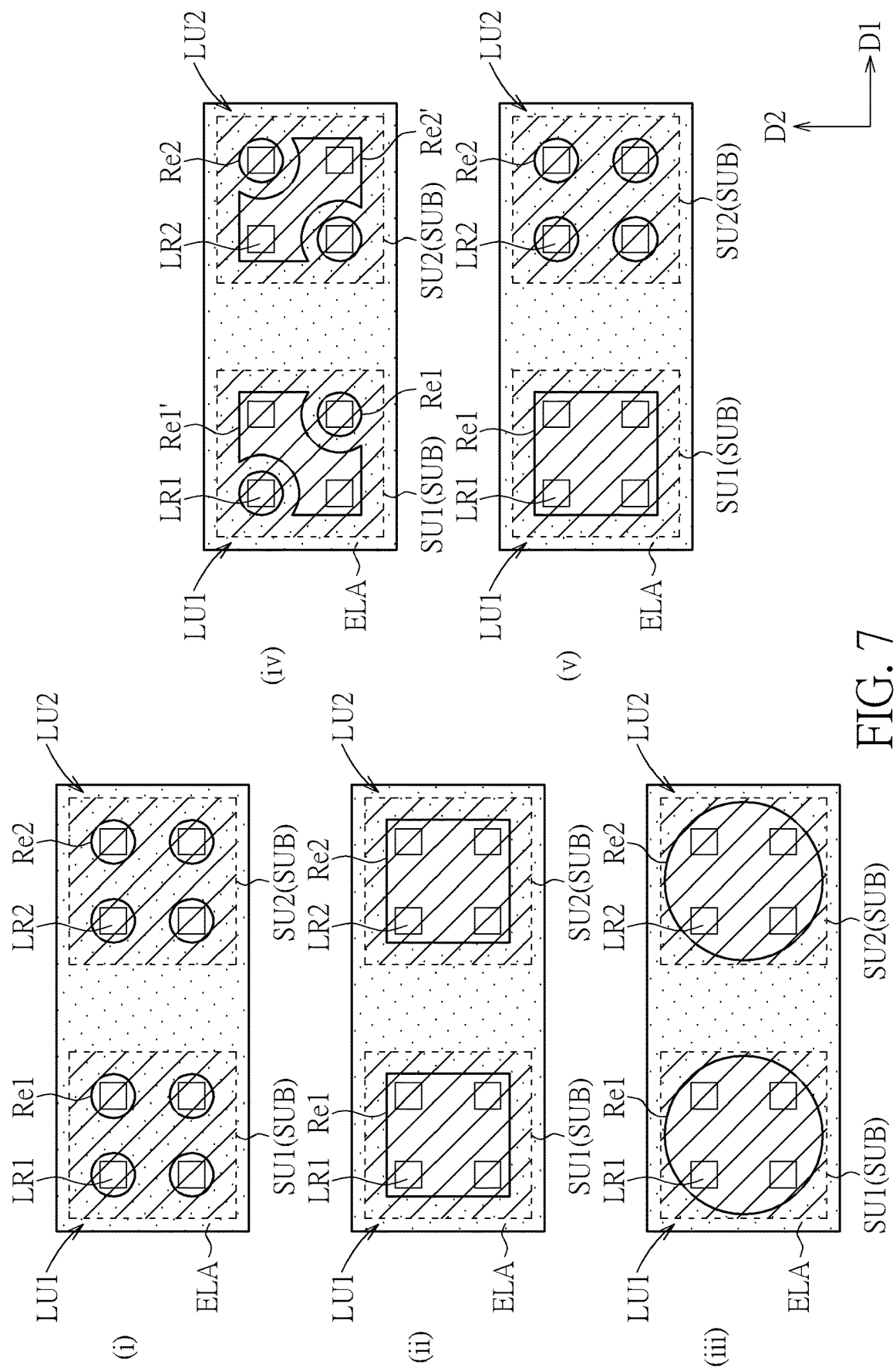
FIG. 7 schematically illustrates a partial top view of a concave of an elasticity layer of the electronic device according to a variant embodiment of the present disclosure.

FIG. 7 schematically illustrates a partial top view of a concave of an elasticity layer of the electronic device according to a variant embodiment of the present disclosure. FIG. 7 illustrates different embodiments of the concave Re1 and the concave Re2 of the elasticity layer ELA, and the conductive line 126 is omitted (conductive line 126 is also omitted in FIG. 8 to FIG. 10, and will not be redundantly described). In case (i), the concave Re1 and the concave Re2 may have circular pattern in a top view. In case (ii), the concave Re1 corresponding to the first display unit LU1 may have rectangular pattern and expose a plurality of first light emitting regions LR1, that is, a first display unit LU1 may include a concave Re1, and the concave Re1 may correspond to a plurality of first light emitting regions LR1. The main difference between case (iii) and case (ii) is that the concave Re1 in case (iii) may have circular pattern in a top view. In case (iv), the concave Re1 and the concave Re1' corresponding to the first display unit LU1 may have different shapes, wherein each of the concaves Re1 is circular and exposes a first light emitting region LR1, and the concave Re1' may have irregular shape and expose a plurality of first light emitting regions LR1. The second display unit LU2 has similar design, and is corresponding to two concaves Re2 and an open-ended concave Re2'. Case (v) mainly illustrates that the concave Re1 of the first display unit LU1 and the concave Re2 of the second display unit LU2 may have different designs. For example, the design of the concave Re1 may be similar to the design in case (ii), and the design of the concave Re2 may be similar to the design in case (i), but not limited thereto. Each of the shapes disclosed in case (i) to case (iv), and the first embodiment mentioned above may be chosen and combined with each other.

Figure 8:
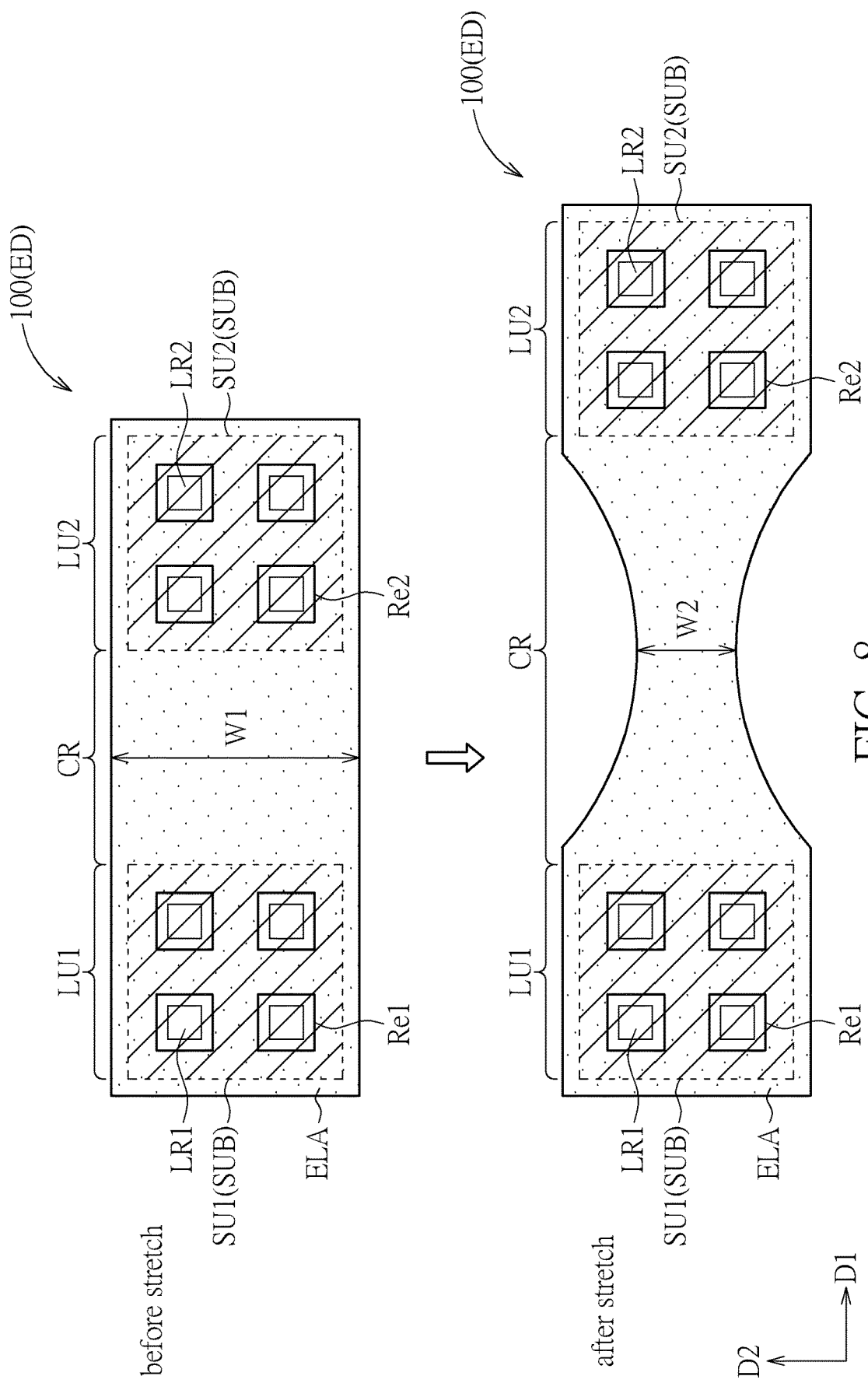
FIG. 8 schematically illustrates a partial top view of an electronic device before and after stretch according to a sixth embodiment of the present disclosure.
Figure 9:
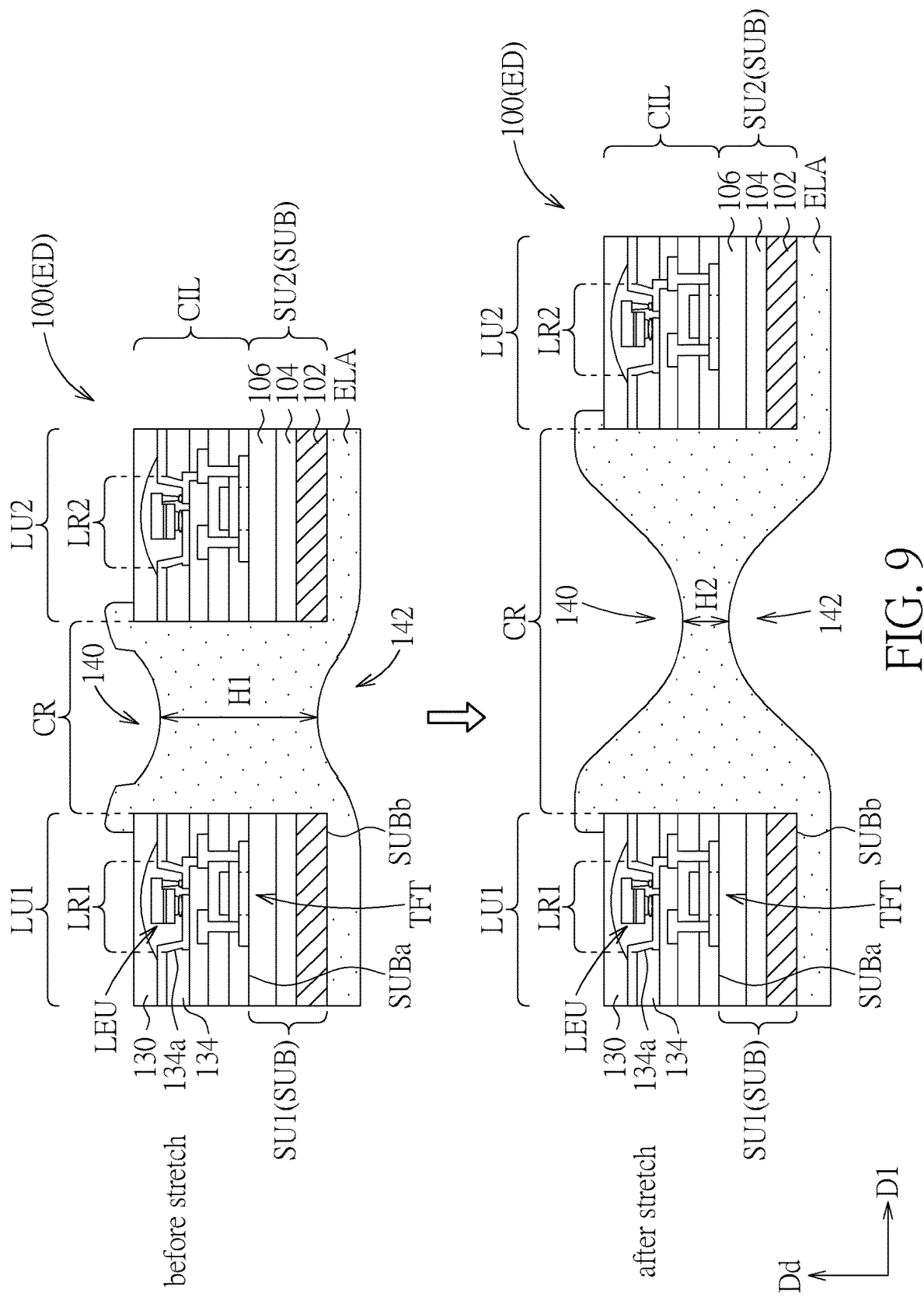
FIG. 9 schematically illustrates a cross-sectional view of the electronic device shown in FIG. 8 before and after stretch.

FIG. 8 schematically illustrates a partial top view of an electronic device before and after stretch according to a sixth embodiment of the present disclosure, FIG. 9 schematically illustrates a cross-sectional view of the electronic device shown in FIG. 8 before and after stretch. As shown in FIG. 8, the connection region CR of the display device 100 may have a minimum width W1 along a direction D2 before the display device 100 is stretched (or the display device 100 is in a status of non-stretched). When the connection region CR of the display device 100 is stretched along a direction D1, the length of the connection region CR along the direction D1 may be greater, but the width may be decreased. For example, the minimum width W2 of the connection region CR after stretched may be lower than the minimum width W2 of the connection region CR before stretched. In this embodiment, the direction D1 may be perpendicular to the direction D2, but not limited thereto. As shown in FIG. 9, the connection region CR may have a minimum thickness H1 (or minimum height) before stretched, and the minimum thickness H2 of the connection region CR after stretch may be lower than the minimum thickness H1 of the connection region CR before stretch, but not limited thereto. The measurement of the minimum thickness H1 (or width, height) is substantially performed by comparing the thickness (or width, height) before and after stretch in the same relative position that is kept away from the first display unit LU1 and the second display unit LU2. For example, in FIG. 9, the minimum thickness H1 before stretch and the minimum thickness H2 after stretch may be measured in the same position, wherein the position is located at the center of the connection region CR and is approximately equidistant from the first display unit LU1 and the second display unit LU2. In other words, the display device 100 may be stretched along the direction D1, and the width and/or thickness of the portion of the elasticity layer ELA located between the first display unit LU1 and the second display unit LU2 (that is, the connection region CR) before stretch or deformation may be different from the width or thickness of the connection region CR after stretch or deformation in some embodiments. In some embodiments, the area of the first display unit LU1 and the second display unit LU2 may not be changed before and after stretch, but the present disclosure is not limited thereto. In some embodiments, the first display unit LU1 and the second display unit LU2 may be designed such that the area of the first display unit LU1 and the second display unit LU2 may be changed after stretch.

Figure 10:
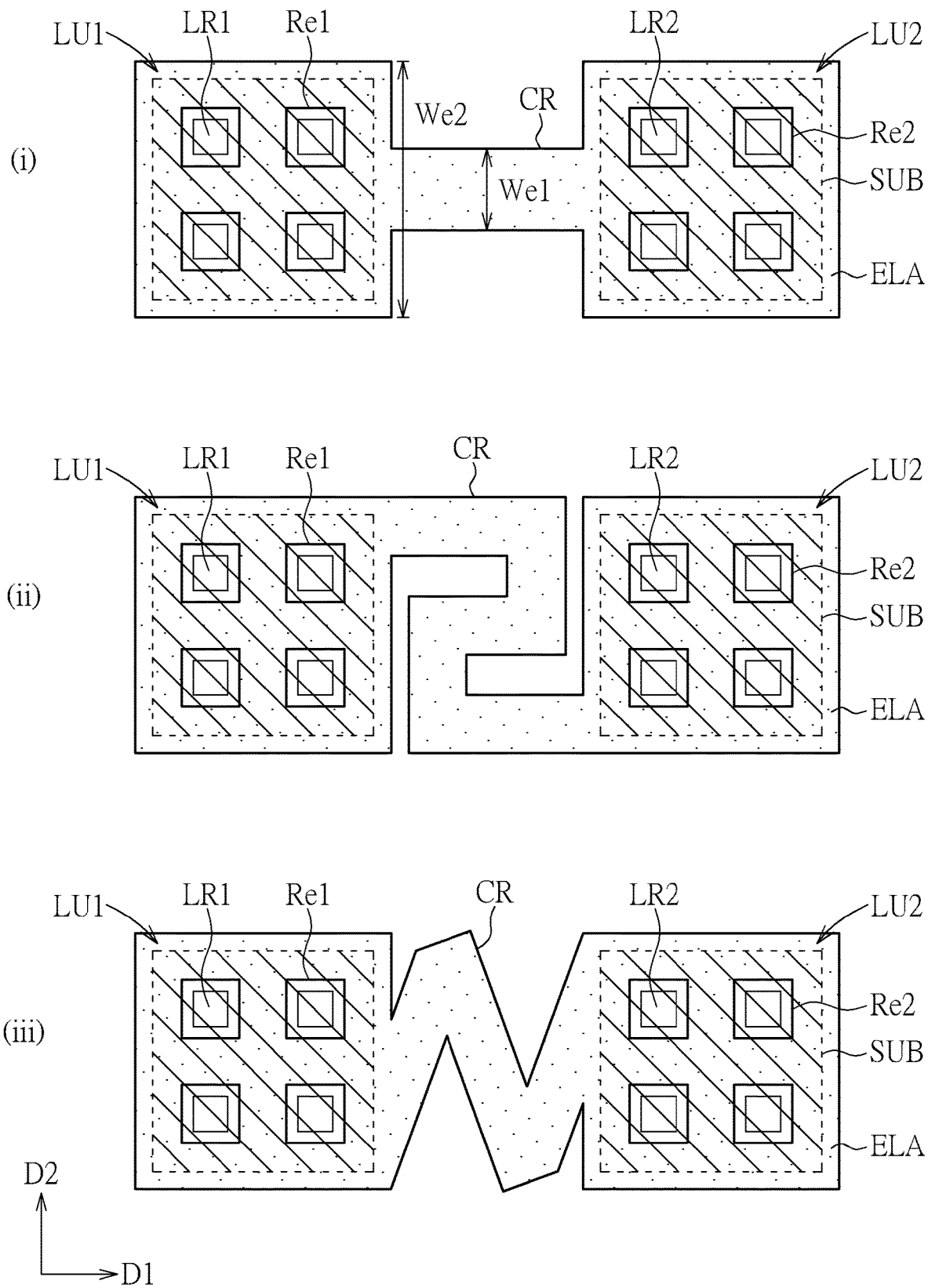
FIG. 10 schematically illustrates a partial top view of an elasticity layer connection region of an electronic device according to a variant embodiment of the present disclosure.

FIG. 10 schematically illustrates a partial top view of an elasticity layer connection region of an electronic device according to a variant embodiment of the present disclosure. In case (i) of FIG. 10, the connection region CR may have lower width along the direction D2, for example, the minimum width We1 of the connection region CR along the direction D2 may be lower than the minimum width We2 of the portion of the elasticity layer ELA corresponding to the first display unit LU1, and the minimum width We1 may also be lower than the width of the first display unit LU1 along the direction D2. In case (ii) of FIG. 10, the connection region CR may have flexible shape, such as the number "2" or the letter "Z", but not limited thereto. The connection region CR may also be folded to form an irregular shape. In case (iii) of FIG. 10, the shape of the connection region CR may have flexible designs such as zigzag, lightning or zipper. When the connection region CR is foldable or has flexible designs, the shape of the connection region CR may be changed during the stretch of the display device 100. As mentioned above, the connection region CR of the present disclosure may have various kinds of folded/unfolded shapes, and is not limited to the examples shown in FIG. 10.

Figure 11:
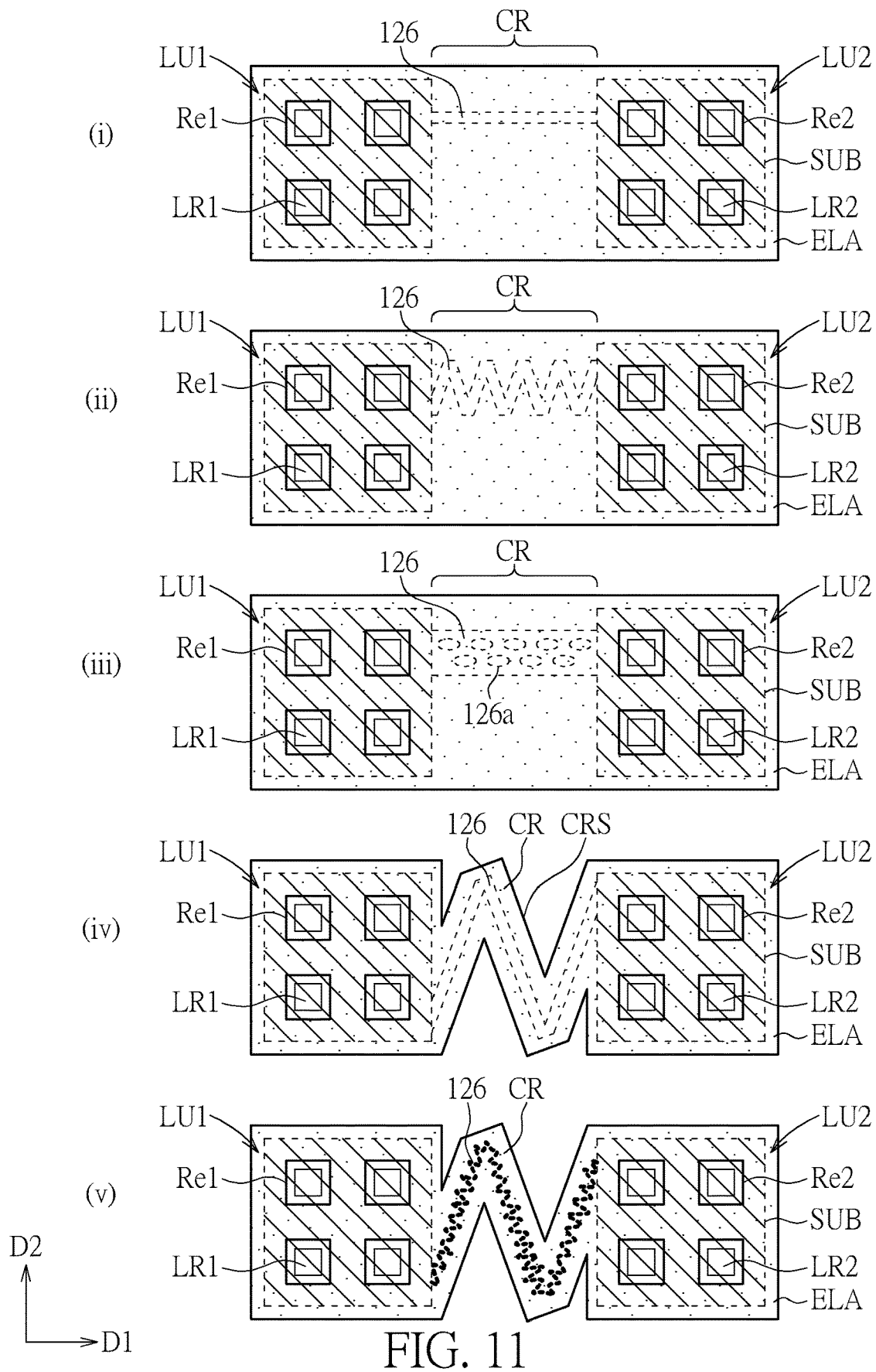
FIG. 11 schematically illustrates a partial top view of a conductive line of an electronic device according to a variant embodiment of the present disclosure.

FIG. 11 schematically illustrates a partial top view of a conductive line of an electronic device according to a variant embodiment of the present disclosure. In case (i) of FIG. 11, the conductive line 126 is extended along the direction D1 in a linear pattern. In case (ii), the conductive line 126 may have a flexible shape such as zigzag. In case (iii), the conductive line 126 may include an opening 126a to release the stress, thereby decreasing the possibility of breakage of the conductive line 126 during deformation process. In case (iv), the connection region CR and the conductive line 126 may have zigzag shape corresponding to each other, that is, a side edge CRS of the connection region CR is not linear or a single smooth curve, instead, the side edge CRS is zigzag-shaped or wave-shaped which includes a plurality of corners. In case (v), the connection region CR may have zigzag pattern, the conductive line 126 may be distributed corresponding to the connection region CR, and the conductive line 126 may be wave-shaped. The conductive line 126 located in the connection region CR may further include anti-breakage design, for example, the conductive line 126 may include openings (such as the opening 126a in case (iii)) or include wider width or include multi-layer structure. Besides, the metal materials with ductility, such as nanowire, may be used in the conductive line 126 corresponding to the connection region CR, but not limited thereto. The pattern and disposition design of the connection region CR and the conductive line 126 of the present disclosure is not limited to what is shown in FIG. 10 and FIG. 11, the shape and the corresponding amount of the conductive line 126 and the connection region CR may be changed according to demands without departing from the spirit and scope of the present disclosure. In some embodiments, the shape of the conductive line 126 is corresponded or not corresponded to the shape of the elasticity layer ELA of the connection region CR. In an embodiment, the entire length of the conductive line 126 may be greater than the entire length of the side edge CRS of the connection region CR in order to maintain transmission of electrical signal without breakage of line during the stretch or deformation of the connection region CR.

Figure 12:
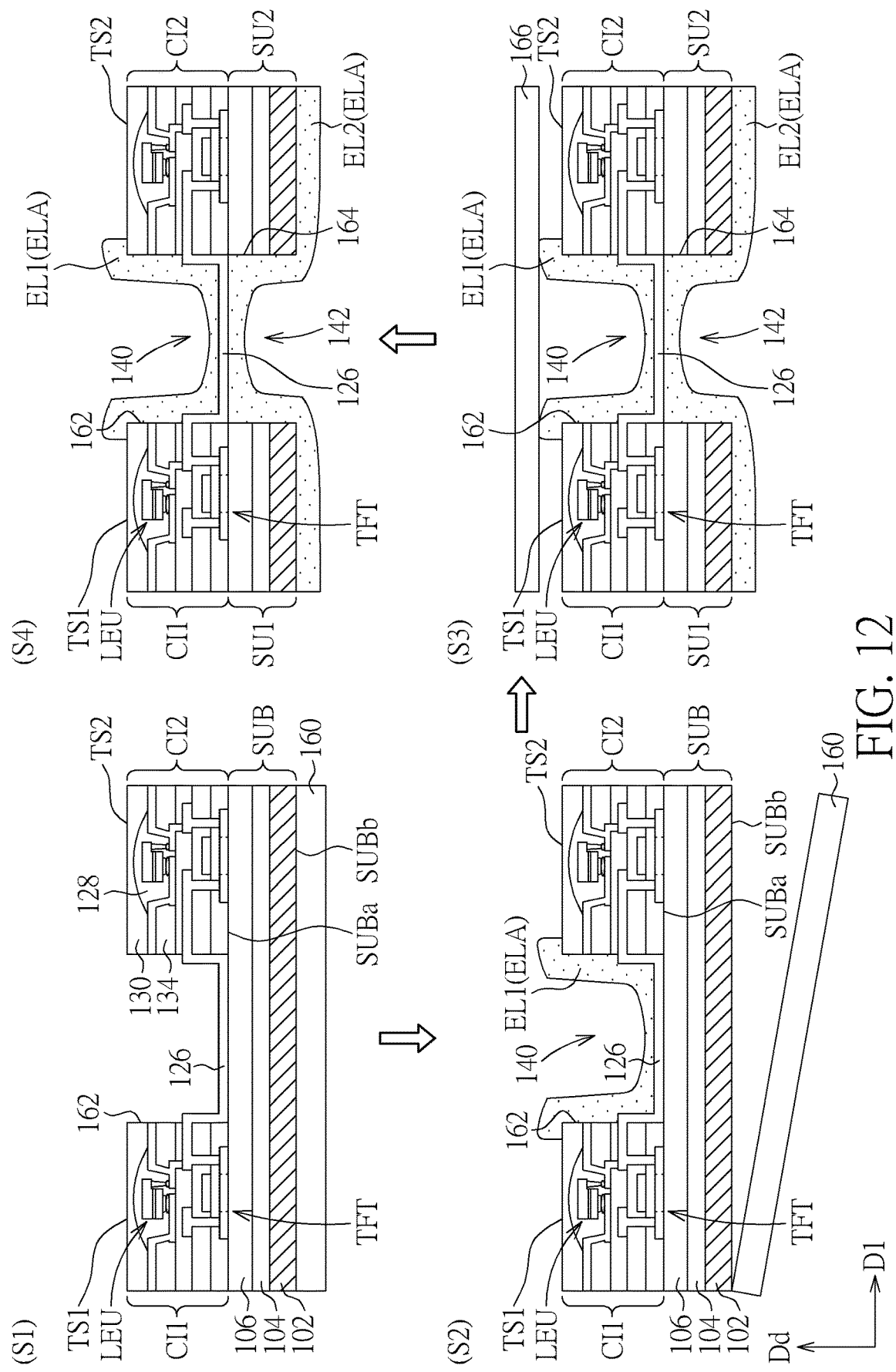
FIG. 12 schematically illustrates a flow chart of a fabrication method of an electronic device according to a first embodiment of the present disclosure.

FIG. 12 schematically illustrates a flow chart of a fabrication method of an electronic device according to a first embodiment of the present disclosure. The fabrication method of the electronic device ED of the present disclosure may include providing a substrate SUB, and a first control layer CI' and a second control layer CI2 is formed on the first surface SUBa of the substrate SUB, wherein a first trench 162 is included between the first control layer CI' and the second control layer CI2, which is shown in process (S1). The first control layer CI' and the second control layer CI2 may respectively include a light emitting element LEU. The process of forming the first control layer CI' and the second control layer CI2 may further include forming at least one conductive line 126 in the first trench 162. In addition, before the first control layer CI' and the second control layer CI2 are formed, the fabrication method of the present disclosure may further include providing a supporting substrate 160 located on the second surface SUBb of the substrate SUB. When the substrate SUB is a flexible substrate, the supporting substrate 160 may provide support during the fabrication process. Then, referring to process (S2) of FIG. 12, an elastic material layer may be formed on the entire substrate SUB, and the elastic material layer may be patterned to form a top elasticity layer EL'. The top elasticity layer EL1 covers a portion of the first control layer CI' and a portion of the second control layer CI2, and covers the sidewall of the first control layer CI' and the second control layer CI2 and the bottom of the first trench 162 to form the upper recess 140. The top elasticity layer EL1 includes concave Re1 and concave Re2 respectively exposing the first light emitting region LR1 and the second light emitting region LR2. After that, the supporting substrate 160 may be removed, that is, the supporting substrate 160 is separated from the lower side of the substrate SUB. Then, in process (S3), a second trench 164 is formed in the substrate SUB. For example, an etching process may be performed at the lower side of the substrate SUB to remove a portion of the substrate SUB, such that the second trench 164, and the first substrate SU1 and the second substrate SU2 separated from each other may be formed. The second trench 164 may be corresponded to the first trench 162. After that, a bottom elasticity layer EL2 may be formed on the second surface SUBb of the substrate and cover the second surface SUBb of the substrate SUB and the second trench 164. The bottom elasticity layer EL2 filled into the second trench 164 may form a lower recess 142 between the first substrate SU1 and the second substrate SU2. Before the second trench 164 is formed, another supporting substrate 166 may be adhered to the upper side of the top elasticity layer EL'. The supporting substrate 166 may be adhered to the top elasticity layer EL1 and the surface of the light emitting region selectively through an adhesive layer. Referring to process (S4), after the bottom elasticity layer EL2 is formed, the supporting substrate 166 may be removed to finish the preliminary production of the electronic device ED.

Figure 13:
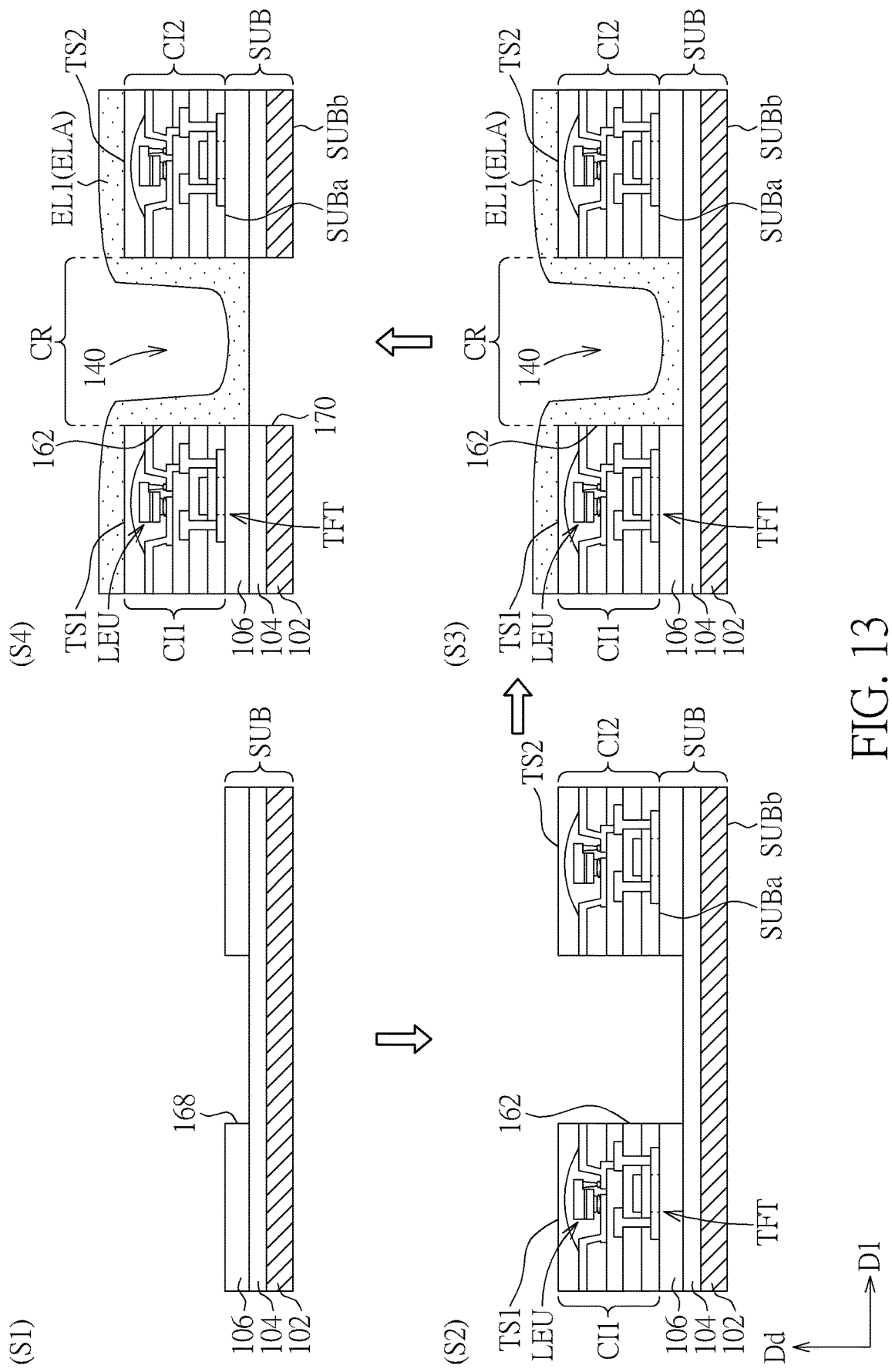
FIG. 13 schematically illustrates a flow chart of a fabrication method of an electronic device according to a second embodiment of the present disclosure.

FIG. 13 schematically illustrates a flow chart of a fabrication method of an electronic device according to a second embodiment of the present disclosure. As shown in process (S1), the fabrication method of the electronic device ED according to the second embodiment of the present disclosure may include providing a substrate SUB, wherein the substrate SUB may include a base 102, a buffer layer 104 and a buffer layer 106. Then, a patterned process is performed to remove a portion of the buffer layer 106, thereby forming a trench 168 in the buffer layer 106. After that, as shown in process (S2), a first control layer CI' and a second control layer CI2 are respectively formed on the remaining buffer layer 106, wherein a first trench 162 is included between the first control layer CI' and the second control layer CI2. After that, as shown in process (S3), a top elasticity layer EL1 is formed on the first control layer CI' and the second control layer CI2, and the top elasticity layer EL1 covers the upper surface and sidewall of the first control layer CI' and the second control layer CI2 and the bottom of the first trench 162 (that is, the surface of the buffer layer 104 exposed by the first trench 162). After that, as shown in process (S4), a portion of the buffer layer 104 and the base 102 may be removed to form a second trench 170, and the second trench 170 is corresponded to the first trench 162 and exposes the top elasticity layer EL1 in the first trench 162.

Figure 14:
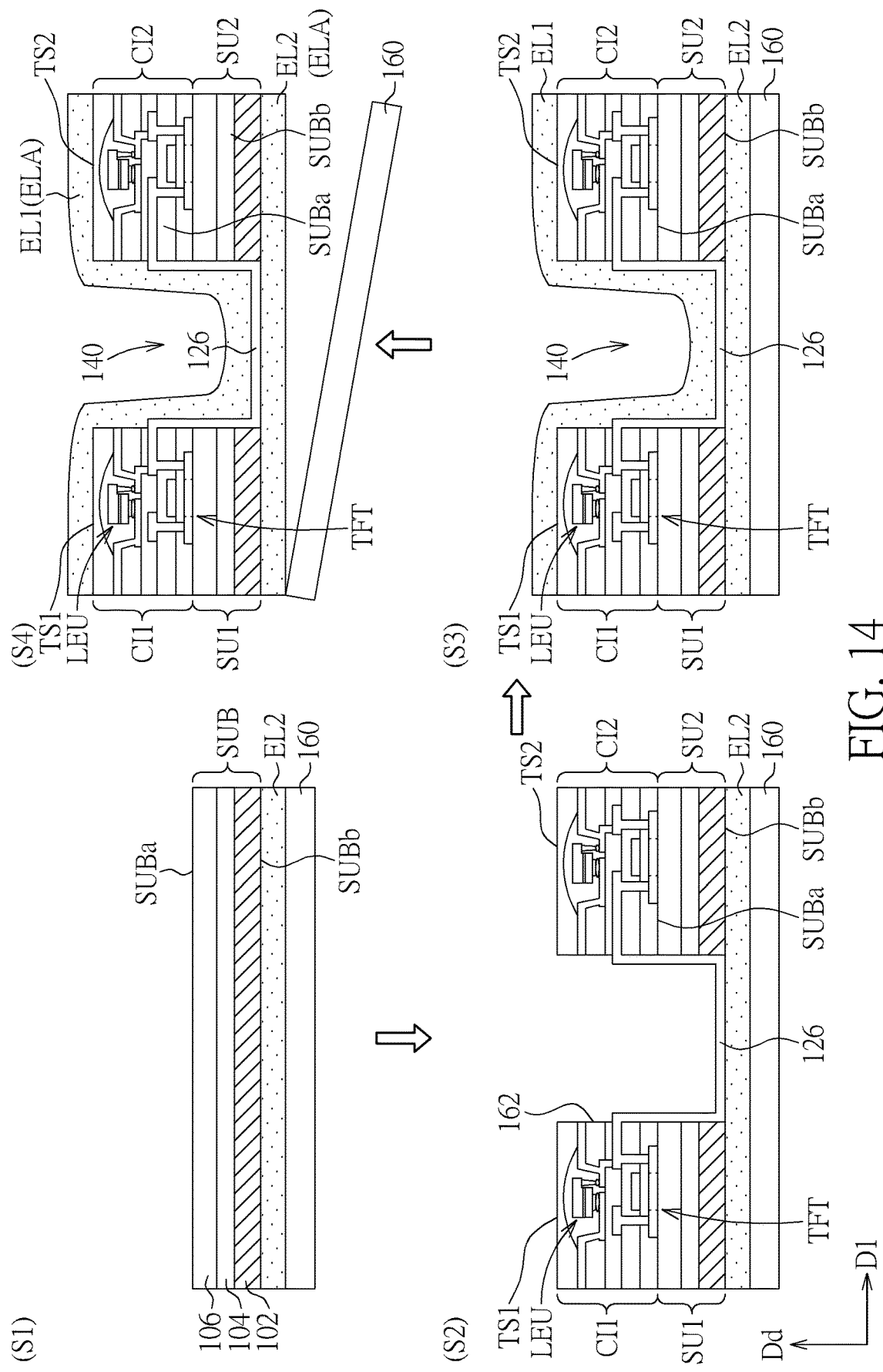
FIG. 14 schematically illustrates a flow chart of a fabrication method of an electronic device according to a third embodiment of the present disclosure.

FIG. 14 schematically illustrates a flow chart of a fabrication method of an electronic device according to a third embodiment of the present disclosure. As shown in process (S1), the fabrication method of the electronic device ED according to the third embodiment of the present disclosure may include providing a substrate SUB and a bottom elasticity layer EL2, wherein the bottom elasticity layer EL2 is located on the second surface SUBb of the substrate SUB. In some embodiments, the bottom elasticity layer EL2 and the substrate SUB may be formed in sequence on a supporting substrate 160, that is, the bottom elasticity layer EL2 is located between the supporting substrate 160 and the substrate SUB, but not limited thereto. After that, as shown in process (S2), a portion of the substrate SUB may be removed to form a first trench 162 in the substrate SUB and to form the first substrate SU1 and the second substrate SU2 which are phase-separated. Then, the first control layer CI' and the second control layer CI2 may be formed on the first surface SUBa of the substrate SUB, and the first control layer CI' and the second control layer CI2 may respectively correspond to the first substrate SU1 and the second substrate SU2. The first trench 162 may be included between the first control layer CI1 and the second control layer CI2. The process of forming the first control layer CI' and the second control layer CI2 may further include forming at least one conductive line 126 in the first trench 162. After that, as shown in process (S3), a top elasticity layer EL1 covering the first control layer CI1, the second control layer CI2 and the first trench 162 may be formed on the substrate SUB. Finally, as shown in process (S4), the supporting substrate 160 may be removed to finish the preliminary production of the electronic device ED of the present disclosure.

Figure 15:
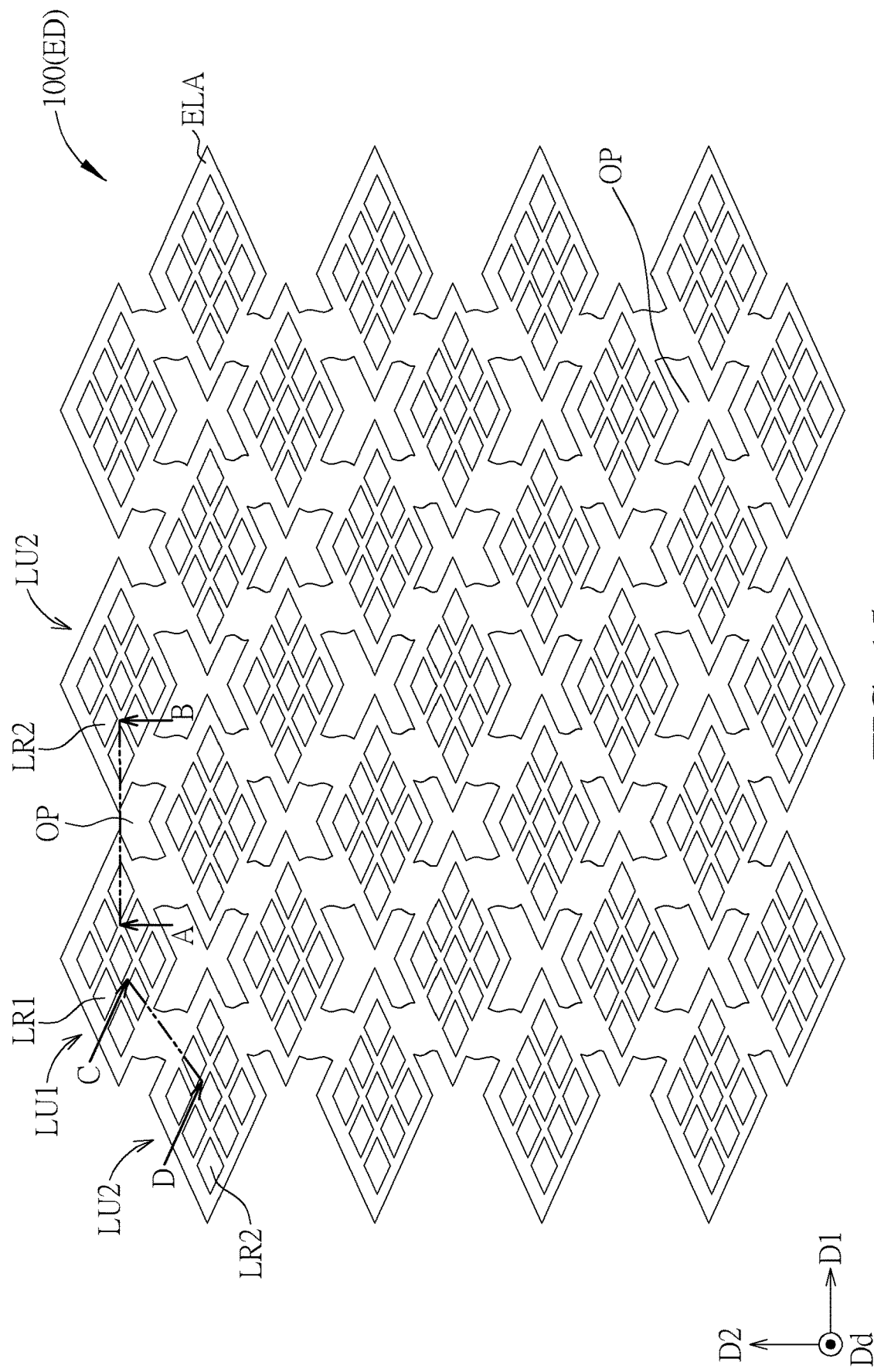
FIG. 15 schematically illustrates a partial top view of an electronic device according to another embodiment of the present disclosure.
Figure 16:
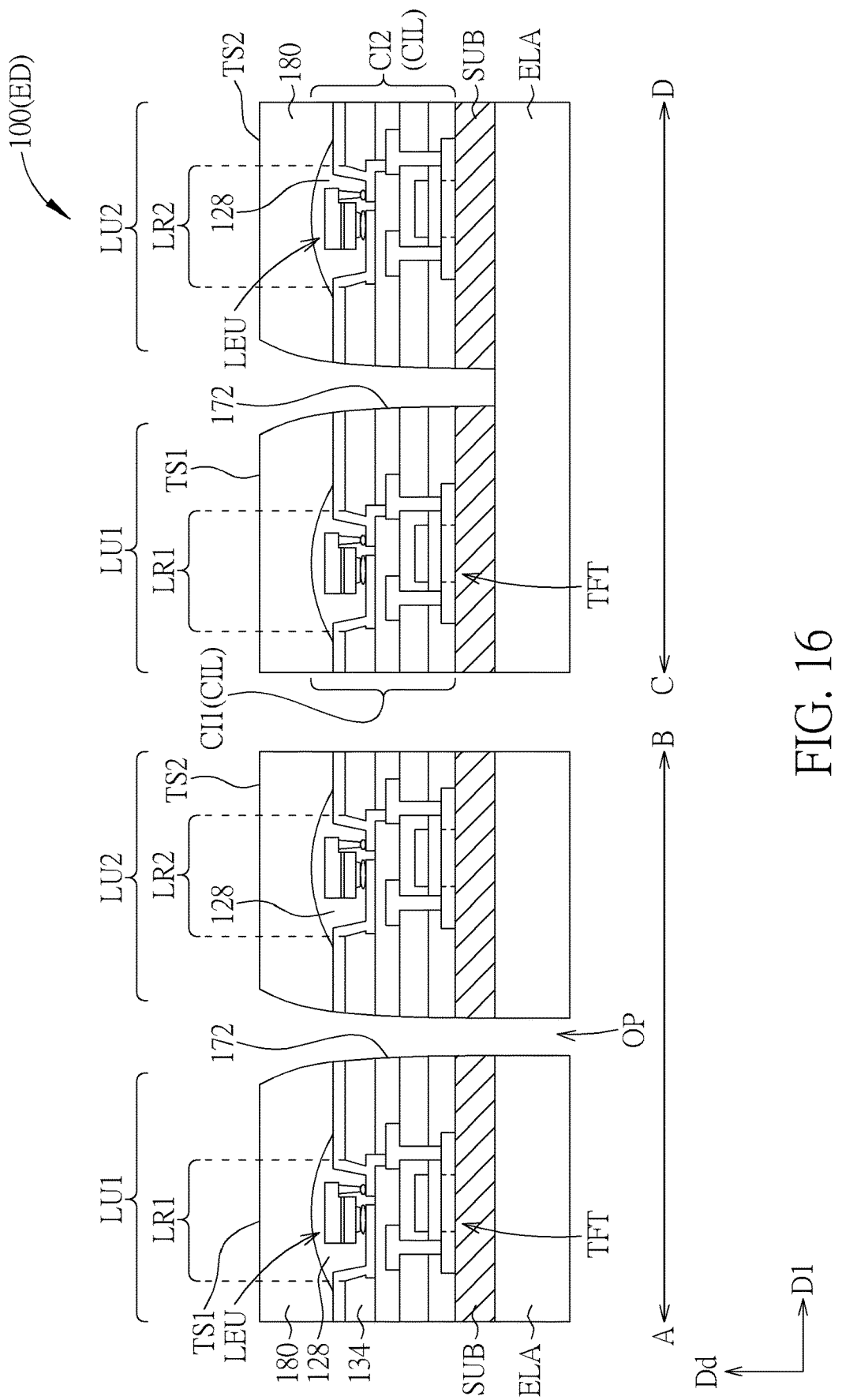
FIG. 16 schematically illustrates a cross-sectional view of the electronic device shown in FIG. 15 along line A-B and line C-D.

FIG. 15 schematically illustrates a partial top view of an electronic device according to another embodiment of the present disclosure, and FIG. 16 schematically illustrates a cross-sectional view of the electronic device shown in FIG. 15 along line A-B and line C-D. As shown in FIG. 15, the electronic device ED may include a plurality of first display units LU1 and a plurality of second display units LU2 adjacent to each other and arranged along the direction D1 and the direction D2 to form an array. As shown in FIG. 16, in the cross-sectional structure across line A-B, the elasticity layer ELA may not be disposed between the first display unit LU1 and the second display unit LU2, that is, an opening OP is included between a portion of the elasticity layer corresponding to the first display unit LU1 and another portion of the elasticity layer corresponding to the second display unit LU2. In another aspect, in the cross-sectional structure across line C-D, the elasticity layer ELA may be included between the first display unit LU1 and the second display unit LU2, that is, the elasticity layer ELA connects the first display unit LU1 and the second display unit LU2. As mentioned above, in the array of the display units, the adjacent display units may be connected by the elasticity layer ELA, or the opening OP of the elasticity layer ELA may be included between the adjacent display units instead of the elasticity layer ELA. In the embodiments shown in FIG. 15, a display unit may be connected to four adjacent display units by the elasticity layer ELA, and the elasticity layer ELA may not be included between the display unit and another four adjacent display units, but the present disclosure is not limited thereto. The number of other display units connected to one display unit and/or the size, shape and position of the opening OP may be adjusted according to the demands. In some embodiments, the fabrication method of the electronic device ED includes forming the substrate SUB (for example including buffer layer) and the control layer CIL (for example including circuit layer, pixel defining layer 134, light emitting element LEU and protection layer 128) on the entire surface of the elasticity layer ELA. After that, a trench 172 may be formed in the layers mentioned above by lithography-etching process, laser process or other suitable process. After that, a functional layer 180 may be formed on the protection layer 128 of the control layer CIL and be patterned to finish the production of the first display unit LU1 and the second display unit LU2. In some other embodiments, the functional layer 180 may be directly formed on the protection layer 128, and then the lithography-etching process, the laser process or other suitable process may be performed to form the trench 172 in the functional layer 180, the pixel defining layer 134, the circuit layer and the substrate SUB in a patterning step, thereby forming the first display unit LU1 and the second display unit LU2. Then, an etching process (or other process like laser process) may be performed on the upper side and/or the lower side of the elasticity layer ELA to remove the portion of the elasticity layer ELA located between the first display unit LU1 and the second display unit LU2 shown in line A-B in order to form the opening OP.

According to the present disclosure, the elasticity layer may be included between two adjacent display units (or working units) of the electronic device, and the elasticity layer may be served as a connection region to connect the two adjacent but spaced display units (or working units). When the electronic device is deformed (such as stretched), the connection region may be the main deforming region, and the connection region may be stretched or deformed according to the demands to change the distance between the adjacent display units (or working units), such that the appearance of the entire electronic device is changed. The elasticity layer may be totally overlapped or partially overlapped with the display unit (or working unit), and the portion of the elasticity layer corresponding to the light emitting region (or working region) of the display unit (or working unit) may have a concave. The portion of the elasticity layer having the concave may for example have thinner thickness or expose the surface of the light emitting region (or working region) in order to reduce the effect of the elasticity layer on the optical performance of the light emitting region (or the performance of electromagnetic waves in the working region).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A stretchable electronic device, comprising: a first electronic unit comprising a first electronic element; a second electronic unit comprising a second electronic element and disposed adjacent to the first electronic unit; an elasticity layer having a conductive line disposed under a recess in a connecting region and electronically connecting the first electronic unit and the second electronic unit, wherein in a top view of the stretchable electronic device, a first width of the connecting region before stretching is greater than a second width of the connecting region after stretching; and the elasticity layer comprises a concave corresponding to the first and second electronic units in a top view direction and a bottom layer enclosed a substrate, wherein the first electronic element and the second electronic element are disposed on the substrate; an insulating layer directly contacts a top surface of the concave.

2. The stretchable electronic device of claim 1, a width difference between the connecting region before stretching and the connecting region after stretching is greater than a width difference between the first electronic unit before stretching and the first electronic unit after stretching.

3. The stretchable electronic device of claim 1, wherein the elasticity layer has at least one recess.

4. The stretchable electronic device of claim 1, wherein in the top view of the stretchable electronic device, an area of the elasticity layer is greater than an area of the substrate.

5. The stretchable electronic device of claim 1, wherein in a cross-sectional view of the stretchable electronic device, a thickness difference between the connection region before stretching and the connection region after stretching is greater than a thickness difference between the first electronic unit before stretching and the first electronic unit after stretching.

6. The stretchable electronic device of claim 1, wherein the elasticity layer covers a top surface of a periphery of the first electronic unit.

\* \* \* \* \*